(12) United States Patent
Schierling

(10) Patent No.: US 11,437,807 B2
(45) Date of Patent: Sep. 6, 2022

(54) ELECTRONIC SWITCH

(71) Applicant: Siemens Aktiengesellschaft, Munich (DE)

(72) Inventor: Hubert Schierling, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/427,466

(22) PCT Filed: Dec. 20, 2019

(86) PCT No.: PCT/EP2019/086730
§ 371 (c)(1),
(2) Date: Jul. 30, 2021

(87) PCT Pub. No.: WO2020/156747
PCT Pub. Date: Aug. 6, 2020

(65) Prior Publication Data
US 2022/0045503 A1 Feb. 10, 2022

(30) Foreign Application Priority Data
Jan. 31, 2019 (EP) .................................. 19154820

(51) Int. Cl.
*H02H 5/04* (2006.01)
*H03K 17/082* (2006.01)
(52) U.S. Cl.
CPC ......... *H02H 5/047* (2013.01); *H03K 17/0828* (2013.01)
(58) Field of Classification Search
CPC ............... H03K 17/08–0828; H02H 5/04–048
See application file for complete search history.

(56) References Cited

U.S. PATENT DOCUMENTS 6,331,763 B1 * 12/2001 Thomas ................ H02J 7/0029
320/136
2009/0021874 A1 * 1/2009 Divito .................... H02H 3/023
361/57

(Continued)

FOREIGN PATENT DOCUMENTS

| EP | 2 017 934 A2 | 1/2009 |
| EP | 3 327 886 A1 | 5/2018 |
| FR | 15 75 029 A | 7/1969 |

OTHER PUBLICATIONS

PCT International Search Report and Written Opinion of International Searching Authority dated Mar. 31, 2020 corresponding to PCT International Application No. PCT/EP2019/086730 filed Dec. 20, 2019.

*Primary Examiner* — Jared Fureman
*Assistant Examiner* — Christopher J Clark
(74) *Attorney, Agent, or Firm* — Henry M. Feierisen LLC

(57) ABSTRACT

An electronic switch has a first semiconductor switch arranged between a first source-side terminal and a first consumer-side terminal first, and a switch embodied as a thyristor and arranged between the first consumer-side terminal and a second source-side terminal. The switch is configured to generate a thermal overload from a short-circuit current produced when the switch closes. The thermal overload causes the first semiconductor switch to irreversibly transition into an open state due to a modification inside the first semiconductor switch caused by the thermal overload. This improves the switching behavior of the electronic switch in the event of a fault. Furthermore, an electrical network with at least one electronic switch connected to an energy source and a method for operating such an electronic switch or such an electrical network is also described.

8 Claims, 4 Drawing Sheets

(56) References Cited

U.S. PATENT DOCUMENTS

2009/0273314 A1* 11/2009 Yoshikawa ......... H01M 10/425
320/134
2018/0145498 A1* 5/2018 Handy ................ H02H 3/023

* cited by examiner

ELECTRONIC SWITCH

CROSS-REFERENCES TO RELATED APPLICATIONS

This application is the U.S. National Stage of International Application No. PCT/EP2019/086730 filed Dec. 20, 2019, which designated the United States and has been published as International Publication No. WO 2020/156747 A1 and which claims the priority of European Patent Application, Serial No. 19154820.5, filed Jan. 31, 20196, pursuant to 35 U.S.C. 119(a)-(d).

BACKGROUND OF THE INVENTION

The invention relates to an electronic switch, wherein the electronic switch has a semiconductor switch, a first consumer-side terminal, a first source-side terminal and a second source-side terminal, wherein the semiconductor switch is arranged between the first source-side terminal and the first consumer-side terminal. The invention further relates to an electrical network with an energy source and at least one electronic switch of this kind. The invention further relates to a method for operating an electronic switch of this kind or an electrical network of this kind.

In electrical networks, electronic switches based on semiconductors are increasingly being used for switching currents and therefore for protecting electrical consumers. In this context, these electronic switches have a semiconductor switch. As they are used to protect the components in electrical networks, these electronic switches are also referred to as protective devices. In addition to the semiconductor switch, these protective devices can also inter alia have a control circuit and protective equipment, for example for protecting against an excess voltage.

In this context, the electronic switches are often arranged between an energy source and an electrical consumer or a group of electrical consumers. This makes it possible to protect an individual electrical consumer or an entire outgoing circuit with its consumers.

If such an electronic switch does not disconnect the connection, despite a turn-off command, then the branch with the connected consumers or the electrical consumer in question continues to have a live voltage.

This case can be identified by measuring, for example by way of a current measurement or a voltage measurement, at the electronic switch, but cannot be prevented.

The object underlying the invention is to improve an electronic switch with regard to its turn-off behavior in the event of a fault.

SUMMARY OF THE INVENTION

This object is achieved by an electronic switch, wherein the electronic switch has a semiconductor switch, a first consumer-side terminal, a first source-side terminal and a second source-side terminal, wherein the semiconductor switch is arranged between the first source-side terminal and the first consumer-side terminal, wherein a switch is arranged between the first consumer-side terminal and the second source-side terminal, wherein the semiconductor switch is embodied such that it irreversibly transitions into the opened state due to the effect of a thermal overload inside the semiconductor switch, wherein the switch is configured to generate the thermal overload by way of closing the switch and the short-circuit current that forms as a result. This object is further achieved by an electrical network with an energy source and at least one electronic switch of this kind, wherein the first source-side terminal and the second source-side terminal of the electronic switch are connected to the energy source. This object is further achieved by a method for operating an electronic switch of this kind or an electrical network of this kind, wherein the switch is closed when the semiconductor switch and/or the further semiconductor switch is turned off.

Further advantageous embodiments of the invention are specified in the dependent claims.

The invention is based on the knowledge that an electronic switch can be improved by the integration of a switch in the electronic switch. This switch may involve a mechanical switch or a switch based on a semiconductor. This switch is arranged such that the semiconductor switch and the switch are arranged in a series connection in relation to the first and the second source-side terminal. In this context, this series connection can have further elements between the first and the second source-side terminal. In particular, one or more further components can also be, but do not necessarily have to be, arranged between the switch and the second source-side terminal. A further semiconductor switch is given here as an example.

A series connection is understood to mean the serial arrangement of component parts, wherein the voltages at the individual component parts add together. Therefore, the components of a star connection are also to be considered as series connections, even if a branch is present at the neutral point, meaning that the same current does not necessarily flow through the components.

Provided the source-side terminals are connected to an energy source, closing the switch when the semiconductor switch is simultaneously closed causes the formation of a short-circuit current, which overloads the semiconductor switch due to an excessively high current in such a way that the semiconductor switch transitions into an opened state. The opened state is also referred to as a non-conducting state.

Various semiconductor switches are available on the market, in which an overload due to excessively high current leads to a blocking effect of the semiconductor switch. This means that the semiconductor switch transitions into the opened state, also referred to as non-conducting state. This can happen, for example, by bonding wires present in a semiconductor module being thermally overloaded by the excessively high current, and melting. This means that it is no longer possible to establish a conducting connection at the semiconductor switch, and the semiconductor switch therefore transitions into the opened state in a safe and permanent manner. Modular semiconductor switches have a highly compact design and generally use bonding wires for making electrical contact.

Should the semiconductor switch not be able to open due to a fault, La cannot transition into the non-conducting state by means of a control signal, the consumer-side terminals cannot be switched to voltage-free. This means that the consumer(s) connected to the consumer-side terminals or a subnetwork connected there can no longer be protected in a reliable manner, as it is no longer possible to turn off the energy supply of the energy source. This state can be reliably identified in various ways, for example by means of sensors such as a current sensor or a voltage sensor. If the fault is identified, the switch can then be closed. The arising short-circuit current, which is driven by the energy source, modifies the semiconductor switch such that it transitions into the opened state. In this context, the switch can be switched on each time the semiconductor switch is opened, or only when a malfunction such as a failure to turn off the semiconductor switch is identified. Provided the semiconductor switch opens as intended, the switch has no effect on the semiconductor switch. In the event of a failure to switch, however, it ensures that the semiconductor switch turns off safely, in that it transitions into the opened state due to the excess current. In this context, the switch can be closed at the same time as the semiconductor switch turns off, or it can be provided with a time delay. With a time delay, it is possible inter alia to reduce the strain on the semiconductor switch and mechanical switch.

There are various methods for identifying a failure to switch the semiconductor switch. A failure can be identified by a logic present in the semiconductor switch, for example. In this context, the electronics of the semiconductor switch monitor the voltage of the semiconductor switch (e.g. evaluating the voltage measurement before and after the switch) and/or the current through the semiconductor switch. If, despite a turn-off command, current continues to flow or the voltage across the switch remains in the range of the forward voltage for a predefined time, for example in the order of magnitude of seconds, then a fault is present. If the switch is opened, the voltage has to drop on the load side, because capacitors present there are discharged; with a discharge time of 5 min, these are typically around 10 V in 5 seconds. Alternatively, a failure to switch can also be identified by an external monitoring that evaluates the signals of the switch (current, voltage) or uses a separate measured-value acquisition.

In this context, the switch can be arranged in a structural unit with the semiconductor switch. Moreover, this structural unit additionally can also comprise the control circuit for the semiconductor switch. This makes it possible to also integrate a logic into this structural unit, in which the switch only closes if a malfunction of the semiconductor switch is identified.

in an advantageous embodiment of the invention, the switch is embodied as a mechanical switch or as a power semiconductor, in particular as a thyristor. A mechanical switch is available on the market at a reasonable price. It is capable of guiding large currents without being thermally overloaded in the process. Its long switching time compared to semiconductor switches can be tolerated, since a time delay between switching off the semiconductor switch and switching on the switch is sufficient for the function. It is likewise possible to use a power semiconductor. This is controlled in a comparable or even identical manner to the semiconductor switch, meaning that it is simple to produce. In particular, a thyristor is recommended. This has a high current-carrying capacity and also an effective short-term overload capacity for guiding the short-circuit current. Its disadvantage, of not being able to turn off a current, is of no consequence, as the current comes to a standstill due to the semiconductor switch transitioning into the non-conducting state.

In a further advantageous embodiment of the invention, the electronic switch has a further semiconductor switch and a second consumer-side terminal, wherein the further semiconductor switch is arranged between the second source-side terminal and the second consumer-side terminal. This enables a subnetwork or consumer connected to the consumer-side terminal to be disconnected from the energy source in a multi-pole, in particular two-pole manner when two semiconductor switches are used. This then makes the turned-off part potential-free, meaning that it can also be grounded, for example. Particularly when the electrical network is a DC voltage network, the two-pole turning off with two semiconductor switches is positive, since this network comprises precisely two potentials and therefore two electrical conductors. However, this arrangement can also be expanded to more conductors. Thus, for example, with three semiconductor switches, an electronic switch can be realized for the three phases of a three-phase network.

In a further advantageous embodiment of the invention, the switch is arranged between the first consumer-side terminal and the second consumer-side terminal. With this switch, it is possible to realize a safe turning off in a circuit with two semiconductor switches, i.e. the semiconductor switch and the further semiconductor switch, in a simple manner. In this embodiment, the switch is located between the two semiconductor switches. If both semiconductor switches turn off correctly, the switch has no effect. Even if only one of the two semiconductor switches is functioning correctly, the consumer-side terminals of the electronic switch can be switched to voltage-free, but not to potential-free. Only in the event of a fault in both semiconductor switches, in which both do not turn off, does the switch lead to a short-circuit current through the two semiconductor switches, which transfers at least one of the two semiconductor switches into the opened state in a permanent manner as described above. As a result, redundancy can be achieved in a simple manner, as the electronic switch is also able to switch the consumer-side terminals to voltage-free in the event of a failure to turn off both switches. Due to the redundancy, the reliability of the electronic switch increases. Thus, the safety of the electronic switch with two semiconductor switches is ensured in a simple manner without additional logic by way of only one switch.

In a further advantageous embodiment of the invention, the electrical network is embodied as a DC voltage network or AC voltage network, in particular as a three-phase network. It is particularly difficult for mechanical switches to turn off a direct current, as in this case an arc that occurs has to be extinguished. In this case, electronic switches are particularly suitable for switching direct current, as due to the use of the semiconductor switch, as opposed to mechanical switches, such an arc does not occur. It is therefore possible to dispense with the use of a further protective element, which is expensive and/or lossy for use in DC voltage networks in particular. Thus, by way of the electronic switch, it is possible to achieve a rapid, reliable and simultaneously cost-effective protection of the subnetworks and/or consumers connected on the consumer side.

Moreover, the electronic switch is also suitable for use in an electrical network that is embodied as an AC voltage network, in particular as a three-phase network. Using the semiconductor switch, it is possible to realize short switching times, which are independent of a zero crossing of the current. These electronic switches are thus suitable for any kind of AC voltage network, in particular for 50 Hz and 60 Hz applications, as well as for 16 ⅔ Hz applications. In these networks, corresponding loads, for example loads or subnetworks that are particularly sensitive to excessive currents, can be disconnected from the energy source in a rapid and reliable manner, and thus protected from inadmissibly high currents such as short-circuit currents.

In a further advantageous embodiment of the invention, the electrical network has at least one electrical consumer. Due to its rapid response time, the electronic switch is particularly suitable for protecting the electrical consumer(s) connected on the consumer side. Particularly in the event of a fault, in which an excessively high current can damage or destroy the consumer, this can prevent strain due to an excessively high current. Especially in DC voltage networks, the inductance can be low due to transformers not being present. This low inductance increases the current slew rate in the event of a fault, meaning that currents occur in a short period of time that are inadmissibly high for the consumer, especially also in DC voltage networks. These are prevented by the electronic switch by means of the semiconductor switch, as this is able to turn off in a correspondingly rapid manner, before inadmissibly high current values are reached.

In a further advantageous embodiment of the invention, the switch is closed at the same time as, or with a time delay in relation to the point in time of turning off the semiconductor switch and/or the further semiconductor switch. The closing of the switch can be performed without a time delay in relation to turning off the semiconductor switch or semiconductor switches. Due to the rapid response of the semiconductor switch, a short-circuit current is prevented in a reliable manner. At the same time, in the event of a failure to turn off the semiconductor switch, the semiconductor switches or one of the semiconductor switches, a rapid protection is achieved, as by way of simultaneously closing the switch and the short-circuit current that is then produced, the semiconductor switch or at least one of the semiconductor switches is rapidly brought into the opened, i.e. non-conducting state.

It is likewise possible, particularly if the switch is only to be closed in the presence of a fault, to provide a time delay between turning off the semiconductor switch and closing the switch. During this duration of the time delay, a fault behavior of the switch can be safely identified and a closing of the switch can be prompted. The duration of the time delay is then used for safe fault identification, for example by means of a current or voltage sensor.

In a further advantageous embodiment of the invention, the switch is closed when a fault of the semiconductor switch and/or the further semiconductor switch is identified. In this case, the switch is only closed when there is a failure to turn off the semiconductor switch and/or the further semiconductor switch. This reduces the number of switching operations of the switch and thus increases the service life of the switch. Additionally, a switch with only a low number of switching operations, which is therefore available on the market at a reasonable price, can be used for the switch. The mechanical switch is especially subject to wear during its switching process that restricts its service life. Thus, this embodiment is especially suitable for a mechanical switch.

Moreover, it is recommended to provide a time delay for switching on the switch compared to turning off the semiconductor switch and/or further semiconductor switch. For this duration, a failure to switch the semiconductor switch can be safely identified as already described above, and the switch can be switched on. This makes it possible to identify the need to switch on the switch, and implement this, in a reliable manner.

BRIEF DESCRIPTION OF THE DRAWING

The invention is described and explained in more detail below on the basis of the exemplary embodiments shown in the figures. In the drawings.

DETAILED DESCRIPTION OF PREFERRED EMBODIMENTS

Figure 1:
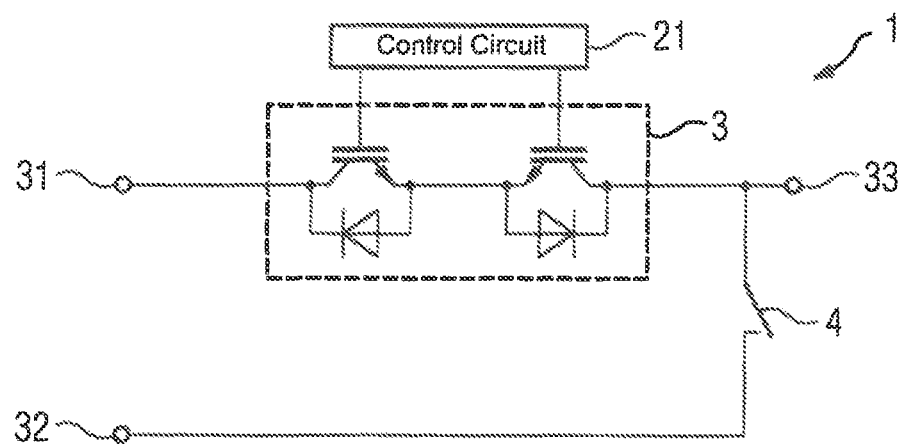
FIG. 1 to FIG. 3 show exemplary embodiments of an electronic switch.

FIG. 1 shows a first exemplary embodiment of an electronic switch 1. This has a first source-side terminal 31, a second source-side terminal 32 and a first consumer-side terminal 33. A semiconductor switch 3 is arranged between the first source-side terminal 31 and the first consumer-side terminal 33. In this exemplary embodiment, said semiconductor switch comprises two individual semiconductors, which are each able to switch current in one direction, so that the semiconductor switch is able to guide and switch currents in both directions. A control circuit 21 is used to control the two semiconductors. In order to ensure a safe turning off of the electronic switch 1, even in the event of a failure to turn off the semiconductor switch 3, a switch 4 is arranged between the first consumer-side terminal 33 and the second source-side terminal 32. In the event of a failure to turn off the semiconductor switch 3, the switch 4 is closed, Between the first and the second source-side terminal, a short-circuit current driven by an energy source 7 (not shown here) is formed, which overloads the semiconductor switch 3 in such a way that it transitions into the blocking, i.e. non-conducting state. A safe separation between the first source-side terminal 31 and the first consumer-side terminal 33 is established as a result. In other words, the first source-side terminal 31 and the first consumer-side terminal 33 are electrically isolated from one another. This electronic switch 1 involves a single-pole switch.

Figure 2:
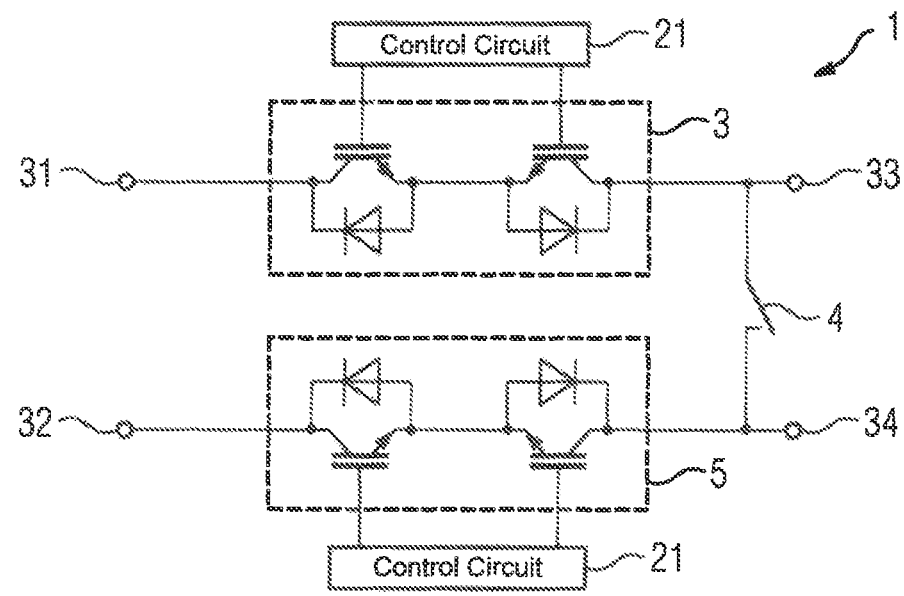

FIG. 2 shows an exemplary embodiment of an electronic switch 1 in the form of a two-pole switch. For the avoidance of repetition, reference is made to the description relating to FIG. 1 and the reference characters therein. This electronic switch 1 has a second consumer-side terminal 34 in addition to the previously mentioned terminals. A further semiconductor switch 5 is now arranged between the switch 4 and the second source-side terminal 32. The switch 4 is located between the first consumer-side terminal 33 and the second consumer-side terminal 34, The further semiconductor switch 5 is located between the second source-side terminal 32 and the second consumer-side terminal 34. In this context, the semiconductor switch 3 and the further semiconductor switch 5 are able to use the same control circuit 21 or, as shown in this figure, can be connected to different control circuits 21. In the event of a failure to turn off the semiconductor switch 3 and further semiconductor switch 5, closing the switch 4 brings about a short-circuit current, which is driven by an energy source 7 (not shown here) and transitions at least one of the semiconductor switches 3, 5 or both semiconductor switches 3, 5 into the nonconducting state, thus opening the electronic switch 1.

The exemplary embodiment of the two-pole electronic switch 1 in accordance with FIG. 2 is especially suitable for use in a DC voltage network, where the energy is transferred by means of two potentials, between which a DC voltage is applied. Likewise, the single-pole electronic switch in accordance with FIG. 1 is especially suitable for use in a DC voltage network when it is sufficient to establish the voltage-free state. This is the case, for example, if the subnetworks interconnected via the electronic switch are grounded.

Figure 3:
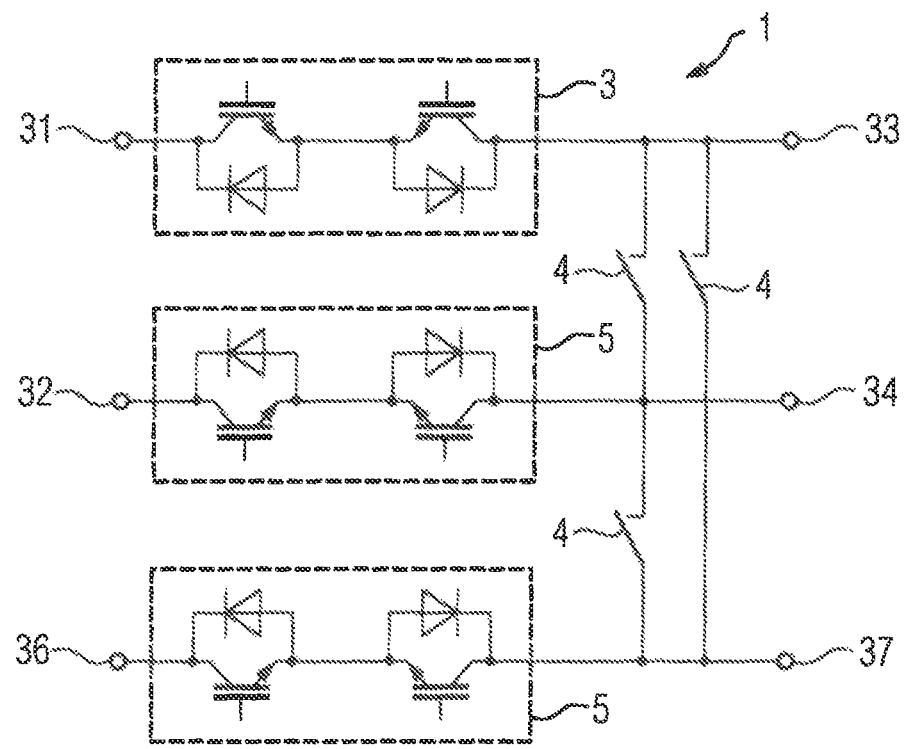

FIG. 3 shows an electronic switch for a three-phase network as an example of an AC voltage network. For the avoidance of repetition, reference is made to the description relating to FIGS. 1 and 2 and the reference characters therein. For connecting on the source and consumer side, this electronic switch 1 has a further source-side terminal 36 and a further consumer-side terminal 37. In this context, in this arrangement three switches 4 are present and are arranged between the consumer-side terminals 33, 34, 37. This may take place in a delta connection, for example, as shown. Alternatively, it is also possible to arrange the three switches 4 of a three-phase network in a star connection. As soon as the semiconductor switches 3, 5 open, the switches 4 can be closed. This can take place at the same time, or with a time delay. Provided at least two of the three semiconductor switches 3, 5 open, the energy transfer between the source-side terminals 31, 32, 36 and the consumer-side terminals 33, 34, 37 is interrupted. If there is a failure to turn off in the case of two or even all three semiconductor switches 3, 5, a short-circuit current is generated via at least one of the switches 4, which leads to the remaining semiconductor switches 3, 5 transitioning into the opened state, in the worst case except for one of the semiconductor switches 3, 5. This means that energy transfer is safely interrupted by the electronic switch 1.

Figure 4:
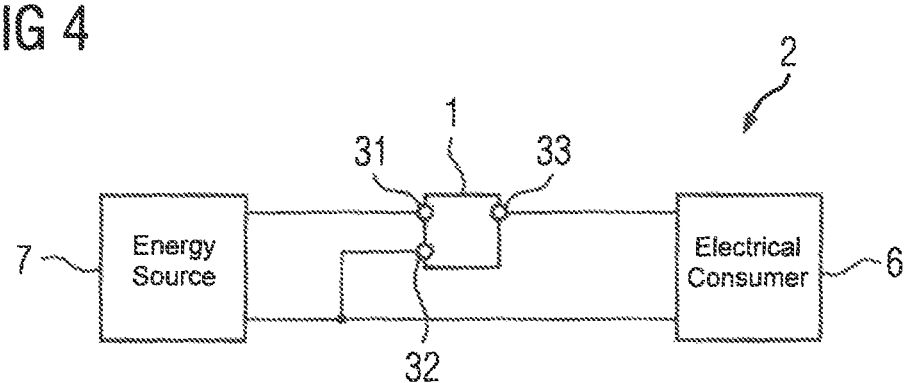
FIG. 4 and FIG. 5 show exemplary embodiments of an electrical network.

FIG. 4 shows an exemplary embodiment of an electrical network 2. This can involve a DC voltage network or an AC voltage network. The electronic switch 1 is arranged between an energy source 7 and an electrical consumer 6, in order to protect the electrical consumer 6. A single-pole electronic switch 1 is involved in this context. However, a two-pole electronic switch 1 can also be used, as shown in FIG. 2. Likewise, it is also possible for a plurality of electrical consumers 6 or an electrical subnetwork to be arranged at the consumer-side terminals 33, 34 of the electronic switch 1.

Figure 5:
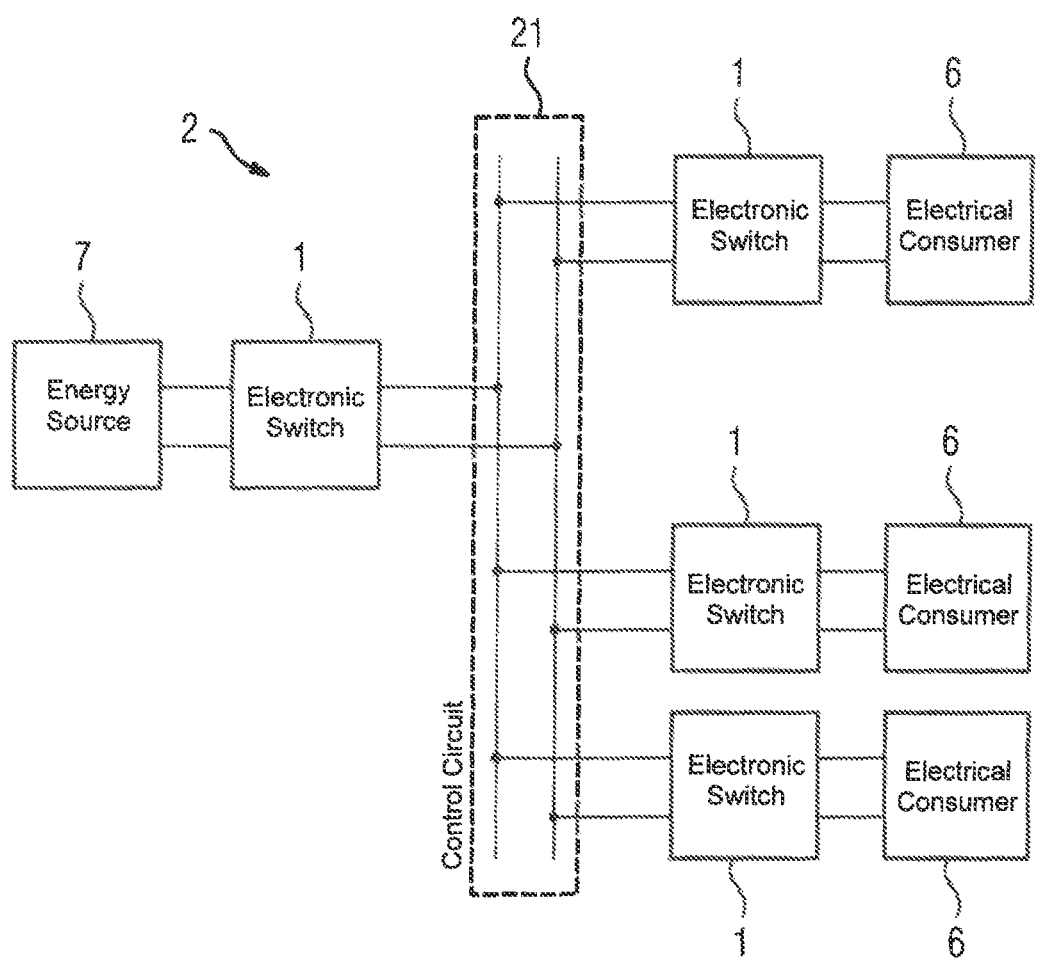

FIG. 5 shows one such exemplary embodiment of an electrical network 2 with a plurality of electronic switches 1. These electronic switches 1 can be designed in a single-pole or two-pole manner in each case. A first electronic switch 1 on the left-hand side of the diagram is used to disconnect the energy source 7 from the electrical subnetwork 21. In turn, a large number of electrical consumers 6 are connected to the electrical subnetwork 21. In this context, each of these electrical consumers 6 can be disconnected from the electrical subnetwork 21 and thus from the energy source 7 via an electronic switch 1. Alternatively, it is also possible to provide an electronic switch 1 as a protective device for a group of electrical consumers 6, i.e. for at least two electrical consumers 6.

Figure 6:
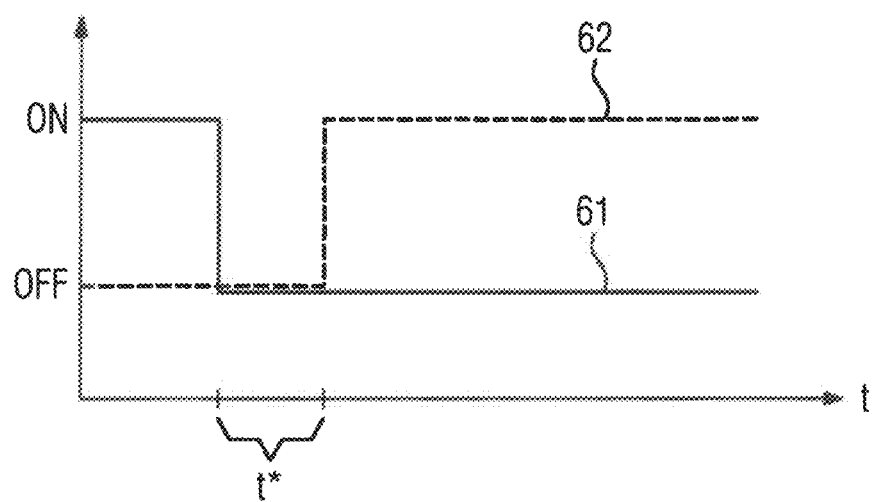
FIG. 6 shows the temporal course of control signals.

FIG. 6 shows the temporal course of a control signal 61 for the semiconductor switch 3 and a control signal 62 for the switch 4. A time delay t* is introduced after switching off the semiconductor switch 3, after the expiration of which the switch 4 is switched on. During the duration of the time delay t*, for example, it is possible to reliably identify a failure to turn off the semiconductor switch, which makes it necessary to switch on the switch 4. Should the switch 4 be switched on independently of the identification of a failure to turn off, the time delay t* can also be chosen to be zero.

In summary, the invention relates to an electronic switch, wherein the electronic switch has a semiconductor switch, a first consumer-side terminal, a first source-side terminal and a second source-side terminal, wherein the semiconductor switch is arranged between the first source-side terminal and the first consumer-side terminal. In order to improve the electronic switch with regard to its turn-off behavior in the event of a fault, it is proposed that the semiconductor switch is embodied such that, in the event of an overload due to exceeding a permissible current value, it transitions into the opened state, wherein a switch is arranged between the first consumer-side terminal and the second source-side terminal.

In other words, in summary, the invention relates to an electronic switch, wherein the electronic switch has a semiconductor switch, a first consumer-side terminal, a first source-side terminal and a second source-side terminal, wherein the semiconductor switch is arranged between the first source-side terminal and the first consumer-side terminal. In order to improve the electronic switch with regard to its turn-off behavior in the event of a fault, it is proposed that a switch is arranged between the first consumer-side terminal and the second source-side terminal, wherein the semiconductor switch is embodied such that it irreversibly transitions into the opened state due to the effect of a thermal overload inside the semiconductor switch, wherein the switch is configured to generate the thermal overload by way of closing the switch and the short-circuit current that forms as a result. This invention further relates to an electrical network with an energy source and at least one electronic switch of this kind, wherein the first source-side terminal and the second source-side terminal of the electronic switch are connected to the energy source. Furthermore, the invention relates to a method for operating an electronic switch of this kind or an electrical network of this kind, wherein the switch is closed when the semiconductor switch and/or the further semiconductor switch is turned off.

What is claimed is:

1. An electronic switch, comprising:
   a first consumer-side terminal;
   a first source-side terminal and a second source-side terminal;
   a first semiconductor switch arranged between the first source-side terminal and the first consumer-side terminal;
   a second semiconductor switch and a second consumer-side terminal, wherein the second semiconductor switch is arranged between the second source-side terminal and the second consumer-side terminal; and
   a switch embodied as a thyristor and arranged between the first consumer-side terminal and the second consumer-side terminal, with the switch being configured to generate a thermal overload from a short-circuit current produced when the switch closes,
   wherein the thermal overload causes at least one of the first and the second semiconductor switches to irreversibly transition into an open state due to a modification inside the at least one first and second semiconductor switch caused by the thermal overload.

2. The electronic switch of claim 1, wherein the at least one first and second semiconductor switch has a modular construction and comprises bonding wires, with the irreversible transition into the open state taking place by melting the bonding wires.

3. The electronic switch of claim 1, wherein the first semiconductor switch comprises bonding wires.

4. The electronic switch of claim 1, wherein the second semiconductor switch comprises bonding wires.

5. An electrical network, comprising:
   an energy source, and
   at least one electronic switch having
   a first source-side terminal and a second source-side terminal connected to the energy source, and a first consumer-side terminal,
   a first semiconductor switch being arranged between the first source-side terminal and the first consumer-side terminal,
   a second semiconductor switch and a second consumer-side terminal, wherein the second semiconductor switch is arranged between the second source-side terminal and the second consumer-side terminal, and a switch embodied as a thyristor and arranged between the first consumer-side terminal and the second consumer side terminal, with the switch being configured to generate a thermal overload from a short-circuit current produced when the switch closes, wherein the thermal overload causes at least one of the first and the second semiconductor switches to irreversibly transition into an open state due a modification inside the at least one first and second semiconductor switch caused by the thermal overload.

6. The electrical network of claim 5, wherein the electrical network is embodied as a DC voltage network or AC voltage network, in particular as a three-phase network.

7. The electrical network of claim 5, comprising at least one electrical consumer.

8. A method for operating at least one electronic switch or an electrical network comprising the at least one electronic switch, the method comprising:

connecting a first semiconductor switch between a first source-side terminal connected to an energy source and a first consumer-side terminal;

connecting a second semiconductor switch between a second source-side terminal connected to the energy source and a second consumer-side terminal;

connecting a switch embodied as a thyristor between the first consumer-side terminal and the second consumer-side terminal; and generating with the switch a thermal overload from a short-circuit current produced when the switch closes, with the thermal overload causing at least one, of the first and the second semiconductor switches to irreversibly transition into an open state due to a modification of the at least one first and second semiconductor switch.

* * * * *